United States Patent [19]
Hollars et al.

[11] Patent Number: 5,814,196
[45] Date of Patent: Sep. 29, 1998

[54] APPARATUS AND METHOD FOR HIGH THROUGHPUT SPUTTERING

[75] Inventors: Dennis R. Hollars, Los Gatos; Delbert F. Waltrip, San Jose; Robert B. Zubeck, Los Altos; Josef Bonigut, Alamo; Robert M. Smith, Antioch; Gary L. Payne, Sunnyvale, all of Calif.

[73] Assignee: Conner Peripherals, Inc., San Jose, Calif.

[21] Appl. No.: 46,215

[22] Filed: Apr. 8, 1993

Related U.S. Application Data

[62] Division of Ser. No. 681,866, Apr. 4, 1991, abandoned.

[51] Int. Cl.$^6$ ..................................................... C23C 14/00
[52] U.S. Cl. ............................... 204/298.15; 204/298.09; 204/298.25; 118/500; 118/728; 118/729
[58] Field of Search ......................... 204/192.12, 298.15, 204/298.25, 298.26, 298.09; 118/728, 729, 500, 505

[56] References Cited

U.S. PATENT DOCUMENTS

| | | | |
|---|---|---|---|
| 4,473,455 | 9/1984 | Dean et al. | 204/298.15 |
| 4,558,388 | 12/1985 | Graves, Jr. | 204/298.15 X |
| 4,735,701 | 4/1988 | Allen et al. | 204/298.15 |
| 4,894,133 | 1/1990 | Hedgroth | 204/298.15 X |
| 5,089,110 | 2/1992 | Allen et al. | 204/298.15 |

FOREIGN PATENT DOCUMENTS

| | | | |
|---|---|---|---|
| 48707 | 7/1987 | Japan | 118/728 |
| 48710 | 10/1987 | Japan | 204/298.15 |

OTHER PUBLICATIONS

Leybold Ag, Model ZV 1200, Feb. 11, 1991.

*Primary Examiner*—Nam Nguyen
*Attorney, Agent, or Firm*—Fliesler, Dubb, Meyer & Lovejoy

[57] ABSTRACT

An apparatus in accordance with the present invention provides a single or multi-layer coating to the surface of a plurality of substrates. The apparatus may include a plurality of buffer and sputtering chambers, and an input end and an output end, wherein said substrates are transported through said chambers of said apparatus at varying rates of speed such that the rate of speed of a pallet from said input end to said output end is a constant for each of said plurality of pallets. A high throughput sputtering apparatus having a plurality of integrally matched components in accordance with the present invention may further include means for transporting a plurality of substrates through said sputtering chambers at variable velocities; means for reducing the ambient pressure within said sputtering chambers to a vacuum level within a pressure range sufficient to enable sputtering operation; means for heating said plurality of substrates to a temperature conducive to sputtering said coatings thereon, said means for heating providing a substantially uniform temperature profile over the surface of said substrates; and control means for providing control signals to and for receiving feedback input from, said sputtering chambers, means for transporting, means for reducing, and means for heating, said control means being programmable for allowing control over said means for sputtering, means for transporting, means for reducing and means for heating.

11 Claims, 10 Drawing Sheets

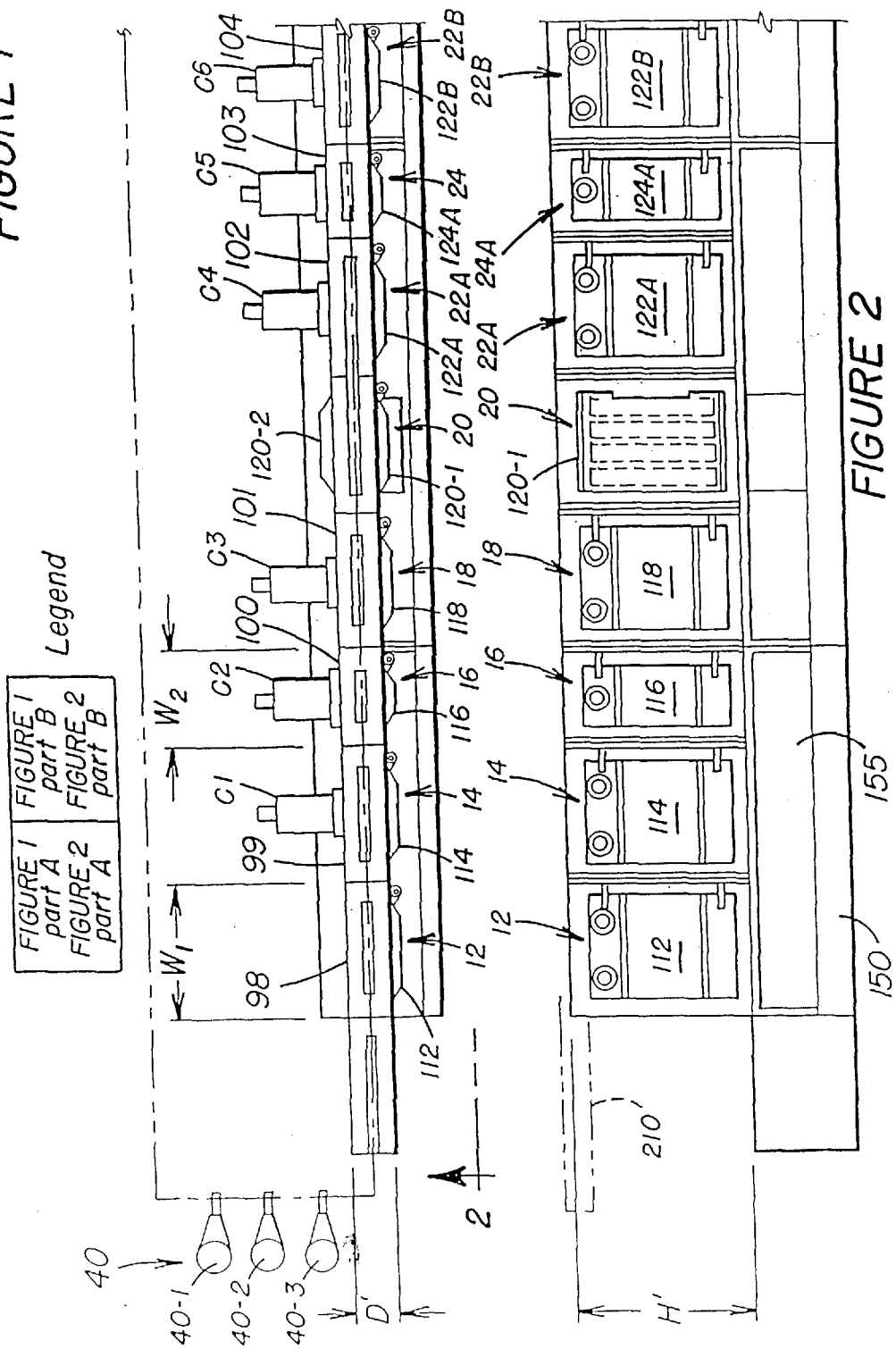

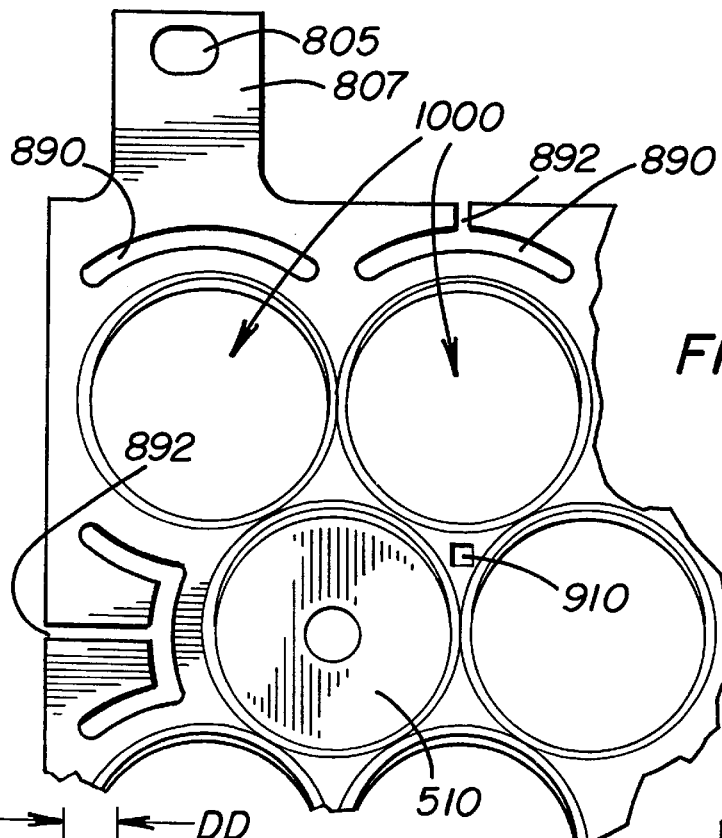
FIGURE 4
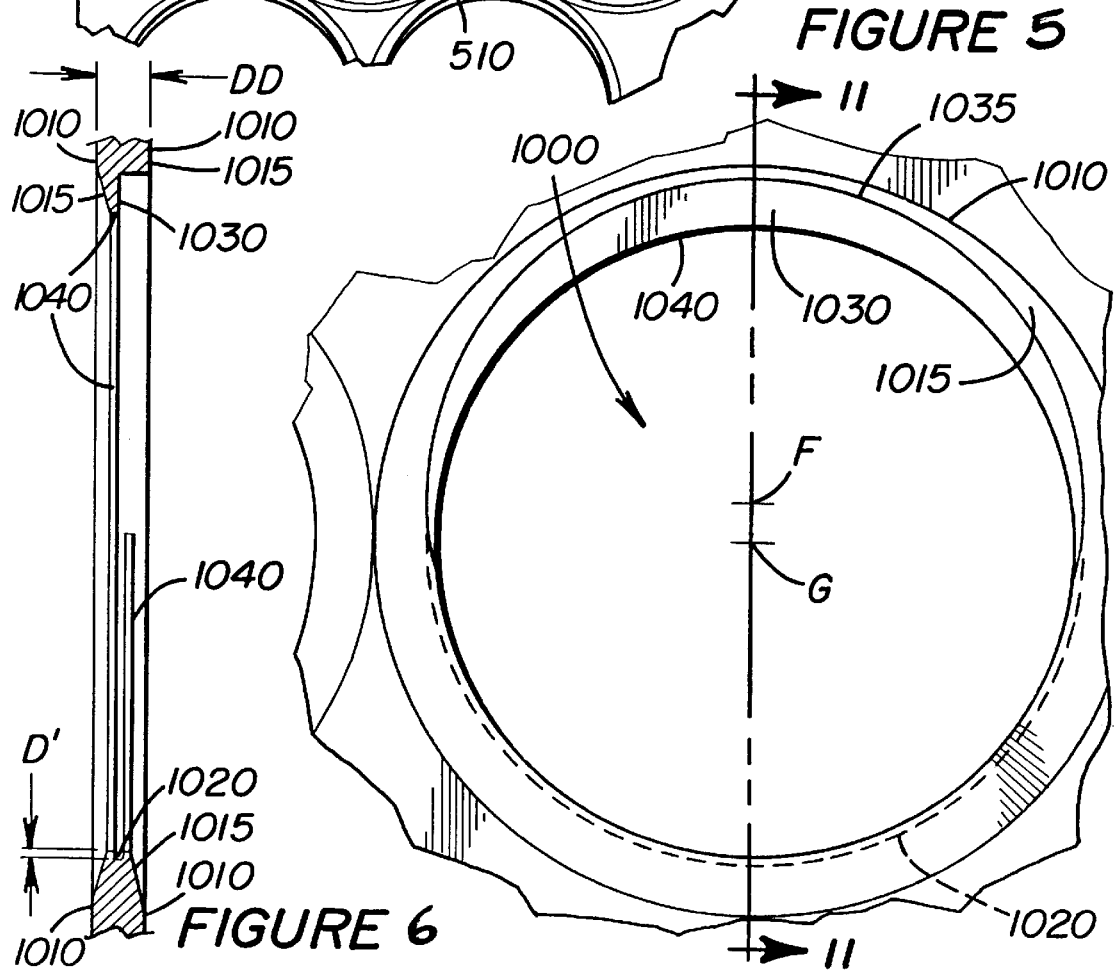
FIGURE 5
FIGURE 6

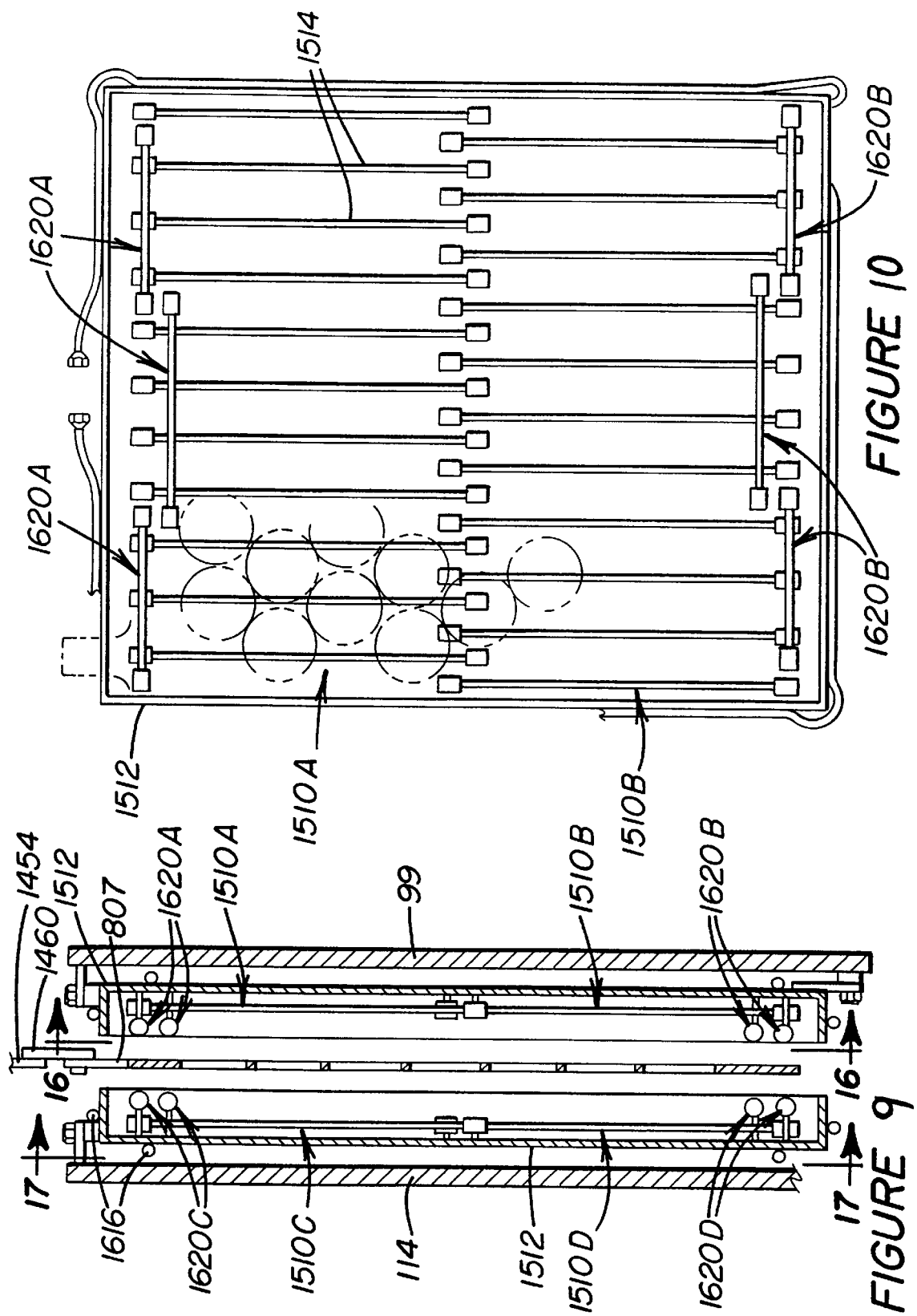

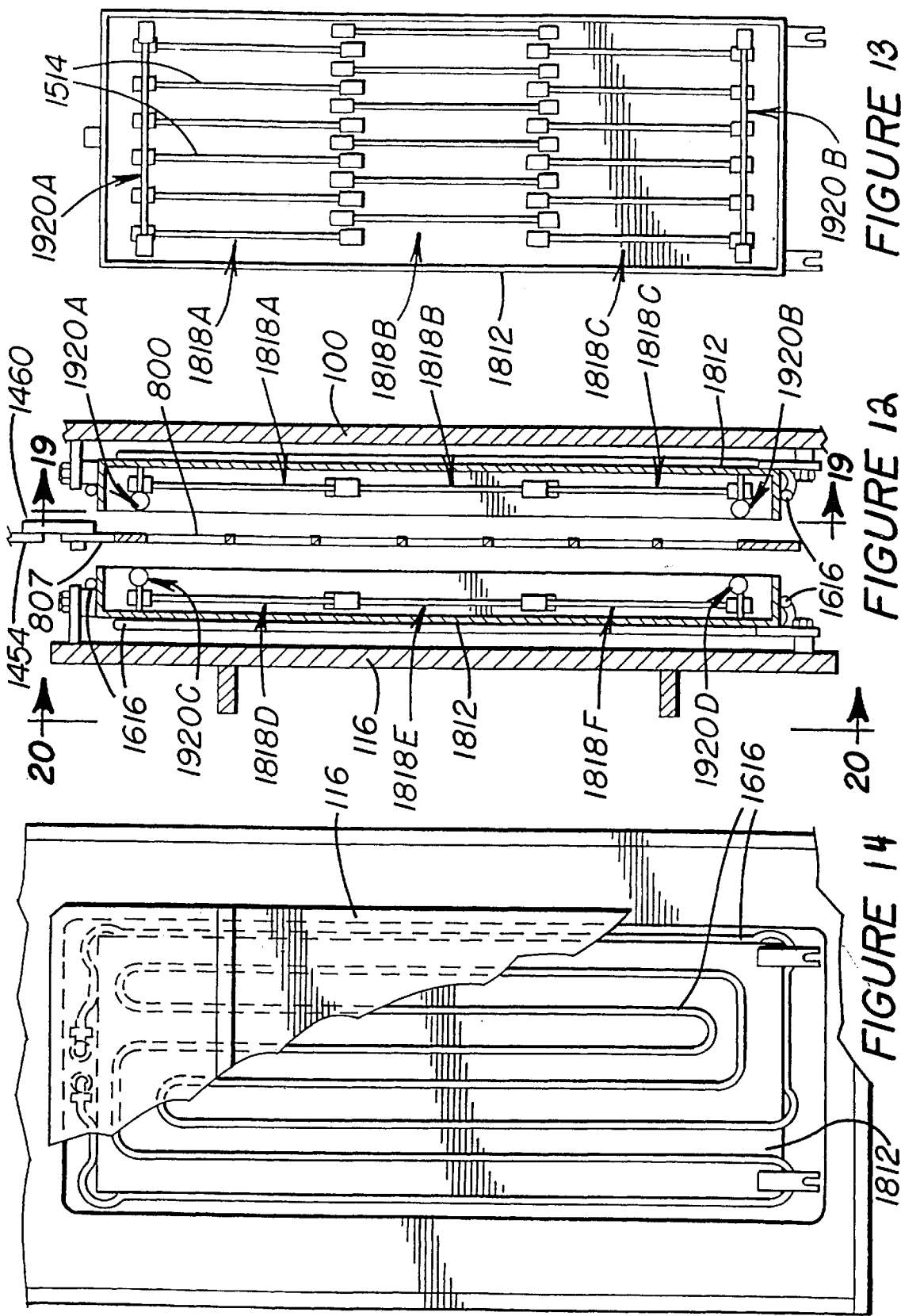

APPARATUS AND METHOD FOR HIGH THROUGHPUT SPUTTERING

This application is a divisional of Ser. No. 07/681,866, filed Apr. 4, 1991 abandoned.

A portion of the disclosure of this patent document contains material to which the claim of copyright protection is made. The copyright owner has no objection to the facsimile reproduction by any person of the patent document or the patent disclosure, as it appears in the U.S. Patent and Trademark Office file or records, but reserves all other rights whatsoever.

BACKGROUND OF THE INVENTION

1. Field of the Invention

The invention relates to an apparatus and method for depositing multilayer thin films in a magnetron sputtering process. More particularly, the invention relates to an apparatus and method for depositing thin magnetic films for magnetic recording media in a high volume, electronically controlled, magnetron sputtering process, and to production of an improved magnetic recording disk product thereby.

2. Description of the Related Art

Sputtering is a well-known technique for depositing uniform thin films on a particular substrate. Sputtering is performed in an evacuated chamber using an inert gas, typically argon, with one or more substrates remaining static during deposition, being rotated about the target (a "planetary" system) or being transported past the target (an "in-line" system).

Fundamentally, the technique involves bombarding the surface of a target material to be deposited as the film with electrostatically accelerated argon ions. Generally, electric fields are used to accelerate ions in the plasma gas, causing them to impinge on the target surface. As a result of momentum transfer, atoms and electrons are dislodged from the target surface in an area known as the erosion region. Target atoms deposit on the substrate, forming a film.

Typically, evacuation of the sputtering chamber is a two-stage process in order to avoid contaminant-circulating turbulence in the chamber. First, a throttled roughing stage slowly pumps down the chamber to a first pressure, such as about 50 microns. Then, high vacuum pumping occurs using turbo-, cryo- or diffusion pumps to evacuate the chamber to the highly evacuated base pressure (about $10^{-7}$ Torr) necessary to perform sputtering. Sputtering gas is subsequently provided in the evacuated chamber, backfilling to a pressure of about 2–10 microns.

The sputtering process is useful for depositing coatings from a plurality of target materials onto a variety of substrate materials, including glass, nickel-phosphorus plated aluminum disks, and ceramic materials. However, the relatively low sputtering rate achieved by the process solely relying on electrostatic forces (diode sputtering) may be impracticable for certain commercial applications where high volume processing is desired. Consequently, various magnet arrangements have been used to enhance the sputtering rate by trapping electrons close to the target surface, ionizing more argon, increasing the probability of impacting and dislodging target atoms and therefore the sputtering rate. In particular, an increased sputtering rate is achieved by manipulation of a magnetic field geometry in the region adjacent to the target surface.

Sputter deposition performed in this manner is generally referred to as magnetron sputtering.

The magnetic field geometry may be optimized by adjusting the polarity and position of individual magnets used to generate magnetic fields with the goal of using the magnetic field flux paths to enhance the sputtering rate. For example, U.S. Pat. No. 4,166,018, issued Aug. 28, 1989 to J. S. Chapin and assigned to Airco, Inc., describes a planar direct current (d.c.) magnetron sputtering apparatus which uses a magnet configuration to generate arcuate magnetic flux paths (or lines) that confine the electrons and ions in a plasma region immediately adjacent to the target erosion region. A variety of magnet arrangements are suitable for this purpose, as long as one or more closed loop paths of magnetic flux is parallel to the cathode surface, e.g., concentric ovals or circles.

The role of the magnetic field is to trap moving electrons near the target. The field generates a force on the electrons, inducing the electrons to take a spiral path about the magnetic field lines. Such a spiral path is longer than a path along the field lines, thereby increasing the chance of the electron ionizing a plasma gas atom, typically argon. In addition, field lines also reduce electron repulsion away from a negatively biased target. As a result, a greater ion flux is created in the plasma region adjacent to the target with a correspondingly enhanced erosion of target atoms from an area which conforms to a shape approximating the inverse shape of the field lines. Thus, if the field above the target is configured in arcuate lines, the erosion region adjacent to the field lines conforms to a shallow track, leaving much of the target unavailable for sputtering.

Even lower target utilization is problematic for magnetic targets because magnetic field lines tend to be concentrated within, and just above, a magnetic target. With increasing erosion of the magnetic target during sputtering, the field strength above the erosion region increases as more field lines 'leak' out from the target, trapping more electrons and further intensifying the plasma close to the erosion region. Consequently, the erosion region is limited to a narrow valley.

In addition to achieving high film deposition rates, sputtering offers the ability to tailor film properties to a considerable extent by making minor adjustments to process parameters. Of particular interest are processes yielding films with specific crystalline microstructures and magnetic Properties. Consequently, much research has been conducted on the effects of sputtering pressures, deposition temperature and maintenance of the evacuated environment to avoid contamination or degradation of the substrate surface before film deposition.

Alloys of cobalt, nickel and chromium deposited on a chromium underlayer (CoNiCr/Cr) are highly desirable as films for magnetic recording media such as disks utilized in Winchester-type hard disk drives. However, on disk substrates, in-line sputtering processes create magnetic anisotropies which are manifested as signal waveform modulations and anomalies in the deposited films.

Anisotropy in the direction of disk travel through such in-line processes is understood to be caused by crystalline growth perpendicular to the direction of disk travel as a result of the deposition of the obliquely incident flux of target atoms as the disk enters and exits a sputtering chamber. Since magnetic film properties depend on crystalline microstructure, such anisotropy in the chromium underlayer can disrupt the subsequent deposition of the magnetic CoNiCr layer in the preferred orientation. The preferred crystalline orientation for the chromium underlayer is with the closely packed, bcc {110} plane parallel to the film surface. This orientation for the chromium nucleating layer forces the 'C' axis of the hcp structure of the magnetic cobalt-alloy layer, i.e., the easy axis of magnetization, to be aligned in the film plane. Similarly, the orientation of the magnetic field generated in the sputtering process may induce an additional anisotropy which causes similar signal waveform modulations. See, Uchinami, et al., "Magnetic Anisotropies in Sputtered Thin Film Disks", *IEEE Trans. Magn.*, Vol. MAG-23, No. 5, 3408-10, September 1987, and Hill, et al., "Effects of Process Parameters on Low Frequency Modulation on Sputtered Disks for Longitudinal Recording", *J. Vac Sci. Tech.*, Vol. A4, No. 3, 547-9, May 1986 (describing magnetic anisotropy phenomena).

Several approaches have been taken to eliminate the aforementioned waveform modulation problems while enhancing magnetic properties in the coating, especially coercivity. For instance, U.S. Pat. No. 4,816,127, issued Mar. 28, 1989 to A. Eltoukhy and assigned to Xidex Corp., describes one means for shielding the substrate to intercept the obliquely incident target atoms. In addition, Teng, et al., "Anisotropy-Induced Signal Waveform Modulation of DC Magnetron Sputtered Thin Films", *IEEE Trans. Magn.*, Vol. MAG-22, 579–581, 1986, and Simpson, et al., "Effect of Circumferential Texture on the Properties of Thin Film Rigid Recording Disks", *IEEE Trans. Magn.*, Vol. MAG-23, No. 5, 3405-7, September 1987, suggest texturizing the disk substrate surface prior to film deposition. In particular, the authors propose circumferential surface grooves to promote circumferentially oriented grain growth and thereby increase film coercivity.

Other approaches to tailoring film properties have focused on manipulating the crystalline microstructure by introducing other elements into the alloy composition. For example, Shiroishi, et al., "Read and Write Characteristics of Co-Alloy/Cr Thin Films for Longitudinal Recording", *IEEE Trans. Magn.*, Vol. MAG-24, 2730-2, 1988, and U.S. Pat. No. 4,652,499, issued Mar. 24, 1987 to J. K. Howard and assigned to IBM, relate to the substitution of elements such as platinum (Pt), tantalum (Ta), and zirconium (Zr) into cobalt-chromium (CoCr) films to produce higher coercivity and higher corrosion resistance in magnetic recording films.

CoCr alloys with tantalum (CoCrTa) are particularly attractive films for magnetic recording media. For example, it is known in the prior art to produce CoCrTa films by planetary magnetron sputtering processes using individual cobalt, chromium and tantalum targets or using cobalt-chromium and tantalum targets.

Fisher, et al., "Magnetic Properties and Longitudinal Recording Performance of Corrosion Resistant Alloy Films", *IEEE Trans. Magn.*, Vol. MAG 22, no. 5, 352–4, September 1986, describe a study of the magnetic and corrosion resistance properties of sputtered CoCr alloy films. Substitution of 2 atomic percent (at. %) Ta for Cr in a Co-16 at. % Cr alloy (i.e., creating a Co-14 at. % Cr-2 at. % Ta alloy) was found to improve coercivity without increasing the saturation magnetization. In particular, a coercivity of 1400 Oe was induced in a 400 Å film. In addition, linear bit densities from 8386 flux reversals/cm to 1063 flux reversals/cm (21300 fci to 28100 fci) were achieved at −3 dB, with a signal-to-noise (SNR) ratio of 30 dB. Moreover, corrosion resistance of CoCr and CoCrTa films was improved relative to CoNi films.

U.S. Pat. No. 4,940,548, issued on Aug. 21, 1990 to Furusawa, et al., and assigned to Hitachi, Ltd., discloses the use of Ta to increase the coercivity and corrosion resistance of CoCr (and CoNi) alloys. CoCr alloys with 10 at. % Ta (and chromium content between 5 and 25 at. %) were sputtered onto multiple layers of chromium to produce magnetic films with low modulation even without texturing the substrate surface and highly desirable crystalline microstructure and magnetic anisotropy.

Development of a high throughput in-line system to produce sputtered CoCrTa films with enhanced magnetic and corrosion-resistance properties for the magnetic recording media industry has obvious economic advantages.

Linear recording density of magnetic films on media used in Winchester-type hard disk drives is known to be enhanced by decreasing the flying height of the magnetic recording head above the recording medium. With reduced flying height, there is an increased need to protect the magnetic film layer from wear. Magnetic films are also susceptible to corrosion from vapors present even at trace concentrations within the magnetic recording system. A variety of films have been employed as protective overlayers for magnetic films, including rhodium, carbon and inorganic nonmetallic carbides, nitrides and oxides, like silica or alumina. However, problems such as poor adhesion to the magnetic layer and inadequate wear resistance have limited the applicability of these films. U.S. Pat. No. 4,503,125 issued on Mar. 3, 1985 to Nelson, et al. and assigned to Xebec, Inc. describes a protective carbon overcoating for magnetic films where adhesion is enhanced by chemically bonding a sputtered layer of titanium between the magnetic layer and the carbon overcoating.

In the particular case of sputtered carbon, desirable film properties have been achieved by carefully controlling deposition parameters. For example, during the sputtering process, the amount of gas incorporated in the growing film depends on sputtering parameters like target composition, sputtering gas pressure and chamber geometry. U.S. Pat. No. 4,839,244, issued on Jun. 13, 1989 to Y. Tsukamoto and assigned to NEC Corp., describes a process for co-sputtering a protective graphite fluoride overlayer with an inorganic nonmetallic compound in a gaseous atmosphere which includes fluorine gas. U.S. Pat. No. 4,891,114 issued on Jan. 1, 1990 to Hitzfeld, et al., and assigned to BASF Aktiengesellschaft of Germany, relates to a d. c. magnetron sputtering process for an amorphous carbon protective layer using a graphitic carbon target.

As the wear-resistant layer for magnetic recording media, it is desirable that the carbon overlayer have a microcrystalline structure corresponding to high hardness. In other words, it is desirable during sputtering to minimize graphitization of carbon which softens amorphous carbon films. One means employed to moderate graphitization of sputtered carbon films is by incorporating hydrogen into the film. Such incorporation may be accomplished by sputtering in an argon atmosphere mixed with hydrogen or a hydrogen-containing gas, such as methane or other hydrocarbons.

Magnetron sputtering processes have been developed which have been somewhat successful in achieving high throughput. For example, U.S. Pat. Nos. 4,735,840 and 4,894,133 issued to Hedgcoth on Apr. 5, 1988 and Apr. 16, 1990, respectively, describe a high volume planar d. c. magnetron in-line sputtering apparatus which forms multilayer magnetic recording films on disks for use in Winchester-type hard disk technology. The apparatus includes several consecutive regions for sputtering individual layers within a single sputtering chamber through which preheated disk substrates mounted on a pallet or other vertical carrier proceed at velocities up to about 10 mm/sec (1.97 ft/min), though averaging only about 3 mm/sec (0.6 ft/min). The first sputtering region deposits chromium (1,000 to 5,000 Å) on a circumferentially textured disk substrate. The next region deposits a layer (200 to 1,500 Å) of a magnetic alloy such as CoNi. Finally, a protective layer (200 to 800 Å) of a wear- and corrosion-resistant material such as amorphous carbon is deposited.

The apparatus is evacuated by mechanical and cryo pumps to a base pressure about $2\times10^{-7}$ Torr. Sputtering is performed at a relatively high argon pressure between 2 and $4\times10^{-2}$ Torr (20 to 40 microns) to eliminate anisotropy due to obliquely incident flux.

In optimizing a sputtering process to achieve high throughput, consideration should be given to other time-influenced aspects of the process apart from the sputtering rate. For example, substrate heating is typically accomplished with heaters requiring an extended dwell time to warm substrates to a desired equilibrium temperature. In addition, substrate transport speeds through the sputtering apparatus have been limited with respect to mechanisms using traditional bottom drive, gear/belt-driven transport systems. Such bottom drive systems generally have intermeshing gears and may be practically incapable of proceeding faster than a particular rate due to rough section-to-section transitions which may dislodge substrates from the carrier and/or create particulate matter from gear wear which contaminates the disks prior to or during the sputtering process. Thus, overall process throughput would be further enhanced by the employment of heating and transport elements which require minimal time to perform these functions.

Generally, prior art sputtering devices utilize relatively unsophisticated means for controlling the sputtering processes described therein. Such control systems may comprise standard optical or electrical metering monitored by a system operator, with direct electrical or electro-mechanical switching of components utilized in the system by the system operator. Such systems have been adequately successful for limited throughput of sputtered substrates. However, a more comprehensive system is required for higher throughput sputtering operations. Specifically, a control system is required which provides to the operator an extensive amount of information concerning the ongoing process through a relatively user-friendly environment. In addition, the control system must adequately automate functions both in series and in parallel where necessary to control every aspect of the sputtering system. Further, it is desirable to include within such a control system the capability to preset a whole series of operating parameters to facilitate rapid set-up of the system for processes employing myriad sputtering conditions.

SUMMARY OF THE INVENTION

Thus, an object of the present invention is to provide a high throughput sputtering process and apparatus.

A further object of the present invention is to provide a control system for the apparatus and process which continuously monitors and facilitates alteration of film deposition process parameters.

A further object of the present invention is to provide a high throughput sputtering apparatus with a centralized electronic control system.

An additional object of this invention is to provide the above objects in a means by which sputtering is achieved in a highly efficient, contaminant-free environment.

An additional object of this invention is to provide a highly versatile, contaminant-free means for transporting substrates through the apparatus and process.

A further object of this invention is to transport substrates through the sputtering apparatus by means of an overhead, gearless transport mechanism.

A further object of this invention is to provide a transport mechanism for carrying a plurality of substrates, each at a user-defined, variable speed.

A further object of this invention is to maintain a contaminant-free environment within the sputtering apparatus by means of a high speed, high capacity vacuum pump system.

A further object of this invention is to provide a magnetron design allowing efficient erosion of target material during the sputtering process.

A further object of this invention is to provide a high throughput sputtering apparatus which achieves and maintains a uniform substrate surface temperature profile before film deposition.

A further object of this invention is to provide a highly isotropic film by minimizing deposition by target atoms impinging on the substrate surface at high angles of incidence.

A further object of this invention is to provide high throughput sputtering apparatus which minimizes oxidation of the chromium underlayer before magnetic film deposition.

An additional object of the present invention is to provide high quality thin magnetic films on magnetic recording media with superior magnetic recording properties.

A further object of this invention is to provide high quality thin cobalt-chromium-tantalum (CoCrTa) films with superior magnetic recording properties.

A further object of this invention is to provide high quality sputtered thin magnetic films circumferentially oriented along the easy magnetic axis.

A further object of this invention is to provide high throughput sputtering apparatus for high quality thin carbon films with superior wear, hardness, corrosion and elastic properties.

A further object of this invention is to provide a method for depositing wear-resistant carbon films comprising sputtering in the presence of a hydrogen-containing gas.

A further object of this invention is to provide an improved method for sputtering carbon films using either an electrically biased or grounded pallet.

These and other objects of the invention are accomplished in a high throughput sputtering apparatus and process capable of producing sputtered substrates at a rate of up to five times greater than the prior art. An apparatus in accordance with the present invention provides a single or multi-layer coating to the surface of a plurality of substrates. Said apparatus includes a plurality of buffer and sputtering chambers, and an input end and an output end, wherein said substrates are transported through said chambers of said apparatus at varying rates of speed such that the rate of speed of a pallet from said input end to said output end is a constant for each of said plurality of pallets. A high throughput sputtering apparatus having a plurality of integrally matched components in accordance with the present invention may comprise means for sputtering a multi-layer coating onto a plurality of substrates, said means for sputtering including a series of sputtering chambers each having relative isolation from adjacent chambers to reduce cross contamination between the coating components being sputtered onto substrates therein, said sputtering chambers being isolated from ambient atmospheric conditions; means for transporting said plurality of substrates through said means for sputtering at variable velocities; means for reducing the ambient pressure within said means for sputtering to a vacuum level within a pressure range sufficient to enable sputtering operation; means for heating said plurality of substrates to a temperature conducive to sputtering said multi-layer coatings thereon, said means for heating providing a substantially uniform temperature profile over the surface of said substrate; and control means for providing control signals to and for receiving feedback input from, said means for sputtering, means for transporting, means for reducing and means for heating, said control means being programmable for allowing control over said means for sputtering, means for transporting, means for reducing and means for heating.

A process in accordance the present invention includes: providing substrates to be sputtered; creating an environment about said substrates, said environment having a pressure within a pressure range which would enable sputtering operations; providing a gas into said environment in a plasma state and within said pressure range to carry out sputtering operations; transporting substrates at varying velocities through said environment a sequence of sputtering steps within said environment and along a return path external to said environment simultaneously introducing the substrates into said environment without substantially disrupting said pressure of said environment, providing rapid and uniform heating of said substrates to optimize film integrity during sputtering steps, and sputtering said substrates to provide successive layers of thin films on the substrates; and, removing the sputtered substrates without contaminating said environment.

BRIEF DESCRIPTION OF THE DRAWINGS

The invention will be better understood by reference to the figures of the drawings wherein like numbers denote like parts throughout and wherein:

FIG. 1 is a system plan view of the sputtering apparatus of the present invention.

FIG. 2 is a cross sectional view along line 2—2 of the sputtering apparatus of the present invention as shown in FIG. 1.

FIG. 4 is a partial, enlarged view of the pallet of FIG. 3.

FIG. 5 is a partial, enlarged view of one region for carrying a disk in the pallet of FIG. 4.

FIG. 6 is a cross sectional view along 11—11 of the disk carrying region shown in FIG. 5.

FIG. 9 is a cross sectional view of the main (or "dwell") heating lamp assembly and chamber.

FIG. 10 is a view of the main heating lamp assembly along line 16—16 in FIG. 9.

FIG. 12 is a cross sectional view of the secondary (or "passby") heating lamp and chamber assembly.

FIG. 13 is a view of the heating lamp assembly along line 19—19 in FIG. 12.

FIG. 14 is a view of the secondary heating lamp, mounting tray and cooling lines along line 20—20 in FIG. 12.

DESCRIPTION OF THE PREFERRED EMBODIMENT

A. Introduction

Figure 3:
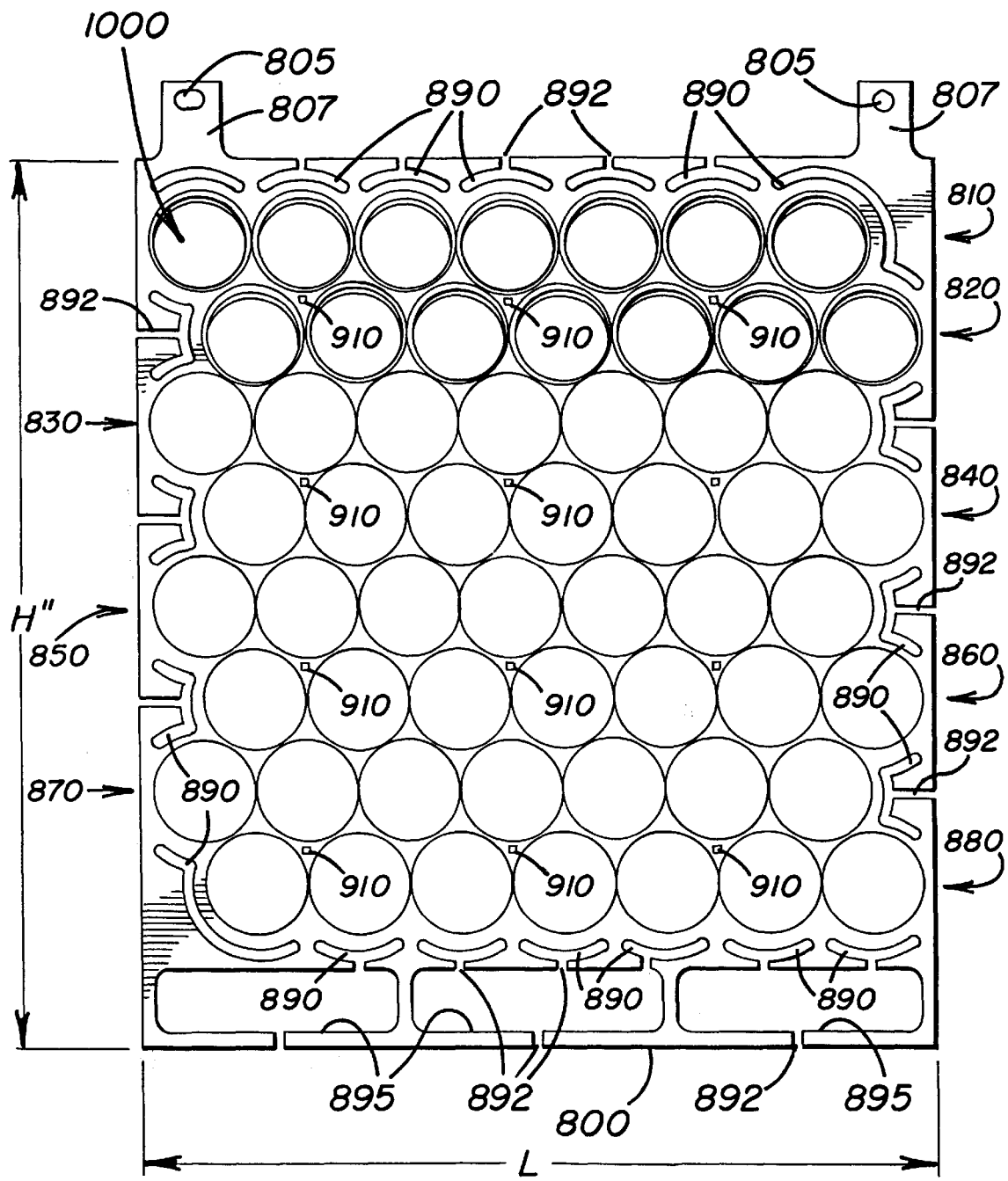
FIG. 3 is a surface view of one embodiment of a pallet for carrying disks through the sputtering apparatus of the present invention.

Described herein is an apparatus and method for applying multilayer thin films to a substrate. The apparatus of the present invention is capable of applying the multilayer coatings to any given substrate within a time frame of approximately five minutes. The apparatus and process may provide production throughputs on the order of at least five times greater than those of prior art multi-layer coating processes.

Other advantages of the sputtering apparatus and method for high throughput sputtering include: flexibility with respect to the composition of the multilayer films applied and the types of substrates to which they are applied; easily interchanged coating components; a novel means for heating substrates; a novel sputtering magnetron design; a variable speed, overhead, noncontaminating substrate transportation system; and a comprehensive, centralized, programmable electronic means for controlling the apparatus and process. In addition, when the process and apparatus are used for providing magnetic coatings for substrates, such as disks, to be utilized in hard disk drives using Winchester-type technology, also disclosed herein are: a unique disk texturing method for improving the disk's magnetic recording properties, and a novel disk carrier (or pallet) design which contributes to uniform substrate heating characteristics in a large, single, high capacity pallet.

The high throughput process and apparatus of the present invention accomplishes the objectives of the invention and provides the above advantages by providing a comprehensive in-line sputtering system utilizing matched component elements to process multiple large single sheet or pallet transported discrete substrates in a continuous, variable speed, sputtering process wherein each substrate has a start-to-finish process time which is relatively constant. Such an apparatus and method can process up to 3,000 95 mm disk substrates, and 5,300 65 mm disk substrates, per hour. In the disk drive industry where cost savings per disk on the order of a few cents are a distinct advantage, the system manufactures 95 mm disk substrates at a cost of $8.00 per disk as opposed to $12.00 per disk for other sputtering apparatus. Crucial to this process and apparatus are matching and optimizing such elements as disk preparation, including texturing and cleaning, provision of a sputtering environment with a sputtering apparatus, through an optimal vacuum pump system, transporting disk substrates through the sputtering environment in a high volume, high speed, contaminant-free manner without disturbing the sputtering environment, heating the substrates within the environment to optimal thermal levels for sputtering, and sputtering the substrates through a series of substantially isolated, non-crosscontaminating sputtering steps.

D. Pallet Design

A unique rack or "pallet" for carrying a number of discrete substrates such as disks utilized in Winchester-type hard disk technology will be discussed with reference to FIGS. 3–6.

Generally, a plurality of magnetic disk sizes are manufactured for Winchester-type hard disk drives; two of the most common include 65 mm and 95 mm diameter disks. It will be understood that the general principles of pallet 800, described herein with reference to a pallet for carrying 95 mm disks, are applicable for pallets equally capable of handling disk substrates of other sizes.

Pallet 800, shown in FIG. 3, shows 56 substrate carrying regions 1000 for carrying 95 mm diameter disk substrates 510. A pallet designed to carry 65 mm diameter disk substrates has 99 substrate-carrying regions 1000. Pallet 800 may be manufactured from 6061-T6 aluminum, available from the Aluminum Corporation of America (Alcoa), Pittsburgh, Pa. or other suitable material. Pallet 800 has a height H" of approximately 34.56 inches, a length L of approximately 31 inches, and a depth DD of approximately 0.25 inch. These dimensions reflect the maximum size pallets or single sheet substrates which may be utilized if sputtering apparatus 10 is made to have dimensions as discussed herein.

In utilizing pallets having the above-mentioned dimensions, several problems arise. Achieving a uniform temperature profile across the surface of the pallet is difficult, especially where thermal expansion of the pallet material occurs at a different rate than that of disk substrates carried therein because of the pallet's greater thickness. Specifically, thermal expansion of the pallet material causes inherent warping of the pallet. Further, thermal expansion reduces the clearance within each substrate-carrying region 1000 around each disk substrate 510, constricting and warping disk substrates 510 undergoing their own thermal expansion, and ultimately precluding uniform film deposition. Addressing thermal expansion incompatibilities between the pallet and disk substrates is more than an issue of material selection. For a high throughput sputtering system, maximizing the substrate-carrying capacity of pallet 800 is equally desirable.

To minimize warping while maximizing the substrate-carrying capacity of pallet 800, substrate-carrying regions 1000 are arranged in a staggered, hexagonal fashion, providing the densest arrangement of disk substrates 510 within the established dimensions of pallet 800. As such, substrate-carrying regions 1000 are arranged in rows 810–880, wherein each substrate-carrying region 1000 in a particular row (e.g., 810) is offset from another substrate-carrying region 1000 in an adjacent row (e.g., 820) by a distance equalling one-half of the total horizontal width of each substrate-carrying region 1000.

In an effort to minimize thermal losses from disk substrates 510 to pallet 800, notches 892 and cavities 895 are provided. Cavities 895 in the lower portion of pallet 800 reduce the surface area of pallet 800 which is subject to thermal expansion, without reducing the substrate-carrying capacity of pallet 800 as the lower portion of pallet 800 does not carry disks beyond the extent of the sputtering flux. Notches 892 compensate for nonuniform thermal expansion across pallet 800 as a result of nonuniform heating across the pallet surface. Specifically, notches 892 allow relatively unrestricted expansion of the edges of pallet 800, thereby avoiding pallet warping.

Reference notches 910 in pallet 800 are provided for use with robotic loading and unloading stations 40 and 45. Specific operation of these stations 40 and 45 is discussed in Section E of the specification.

With reference to FIGS. 5 and 6, details of disk substrate-carrying regions 1000 are hereinafter discussed. Each substrate-carrying region 1000 has a roughly circular orifice with an outer circumferential edge 1010 defined by a beveled edge 1015. Beveled edge 1015 reduces any shielding effect pallet 800 may have on disk substrate 510 mounted in substrate-carrying region 1000 during sputtering. Notch mounting groove 1020 in the lower half of region 1000 allows disk substrate 510 to be seated therein. Lip 1030, at the upper portion of substrate-carrying region 1000, allows manual insertion of disk substrates 510 into substrate-carrying regions 1000. As shown in FIG. 5, lip 1030 defines a semi-circular arc 1035 having a radial distance from axis F of 1.9 inches in the 95 mm embodiment of pallet 800, shown in FIGS. 3–6. Inner edge 1040 is defined by one end of beveled edge 1015 and has a radial distance from axis G of approximately 1.859 inches. Groove 1020 likewise has a semi-circular shape and is positioned a radial distance of 1.883 inches from axis G. Groove 1020 has a depth D' of approximately 0.012 inches.

In practice, disk substrate 510 is seated in groove 1020 and is securely held in place therein. During processing, pallet 800 is relatively stable and disk substrate 510 is securely maintained in substrate-carrying region 1000. The radial distance between axis F and axis G is approximately 0.12 inch, and thus the radial distance between lip region arc 1035 and the base of groove 1020 is 3.903 inches, a distance which is greater than the diameter of a 95 mm disk (3.743 inches). This excess space facilitates disk loading and allows for thermal expansion of disk substrate 510 relative to the pallet 800 during the heating process.

It should be noted that pallet 800 may be passed through sputtering apparatus 10 many times before cleaning, especially of grooves 1020, is required to insure substrate-carrying security within substrate-carrying regions 1000. After approximately 100 production cycles, edge 1040 and groove 1020 must be cleaned due to buildup of deposited layers from constant sputtering in sputtering apparatus 10.

E. Substrate Loading

As discussed briefly with reference to FIG. 1, disk substrates 510 may be provided in pallet 800 by means of an automatic loading process which preferably occurs at a point along transport system return path 50. Robotic loading station 40 is arranged to load disk substrates 510 into pallets 800 just prior to entrance of pallets 800 into load lock chamber 12. Robotic unloading station 45 is preferably positioned to remove disk substrates 510 from pallets 800 just after exit of pallets 800 from exit lock chamber 30.

In the automatic loading/unloading process of the present invention, an automatic pallet loading station 40 and an unloading pallet station 45 built by Intelmatic Corporation of Fremont, Calif. are utilized. Each station uses three Adept Model One robots, controlled by Adept Model CC Compact Controllers and an Elmo Controller operating under conventional control software, tailored for apparatus 10 by Intelmatic Corporation software for controlling the loading processing and sequencing pallet movement. Three robots 40-1, 40-2, 40-3 load pallets 800 in a top to bottom manner, with first robot 40-1 loading the top third of pallet 800, second robot 40-2 loading the middle third of pallet 800 and a third robot 40-3 loading the bottom third of pallet 800. Likewise, three robots 45-1, 45-2, 45-3 unload substrates from pallet 800 in a reverse order to that of robots 40-1, 40-2, 40-3. Specifically, robot 45-1 unloads the bottom third of pallet 800, robot 45-2 then unloads the middle portion of pallet 800 and finally robot 45-3 unloads the top third of pallet 800. Loading and unloading of pallets 800 in this manner ensures that no particulate matter present on pallet 800 or disk substrates 510 falls from the upper portion of pallet 800 to deposit on disk substrates 510 loaded in lower portions of pallet 800 during the loading or unloading process.

The Adept Model One robot and Intelmatic software utilize reference notches 910 in pallet 800 to locate the approximate center of each substrate-carrying region 1000. The Adept robots utilize a single finger-type loading mechanism which engages disk substrates 510 by protruding through the center of each disk substrate 510 and lifts and places disk substrates 510 into grooves 1020 within each substrate-carrying region 1000.

Automatic robots 40-1, 40-2, 40-3 and robots 45-1, 45-2, 45-3 in conjunction with the Intelmatic system, have the capability of loading and unloading, respectively, up to 2,500 disk substrates per hour. Sputtering apparatus 10 has a capability of producing 3,000 95 mm thin magnetic film coated disks per hour. Automatic loading and unloading stations 40, 45 thus represent constraints on production throughput for the present embodiment of the overall sputtering process discussed herein. As will be recognized by those skilled in the art, additional stations may be provided to increase production loading to match apparatus 10 throughput rates.

Pallet 800 may also be manually loaded and unloaded. In manual loading, lip 1030 is used to align the surface of disk substrate 510 with the planar surface of pallet 800 to more accurately provide disk 510 substrate into groove 1020.

G. Transport Mechanism

Figure 7:
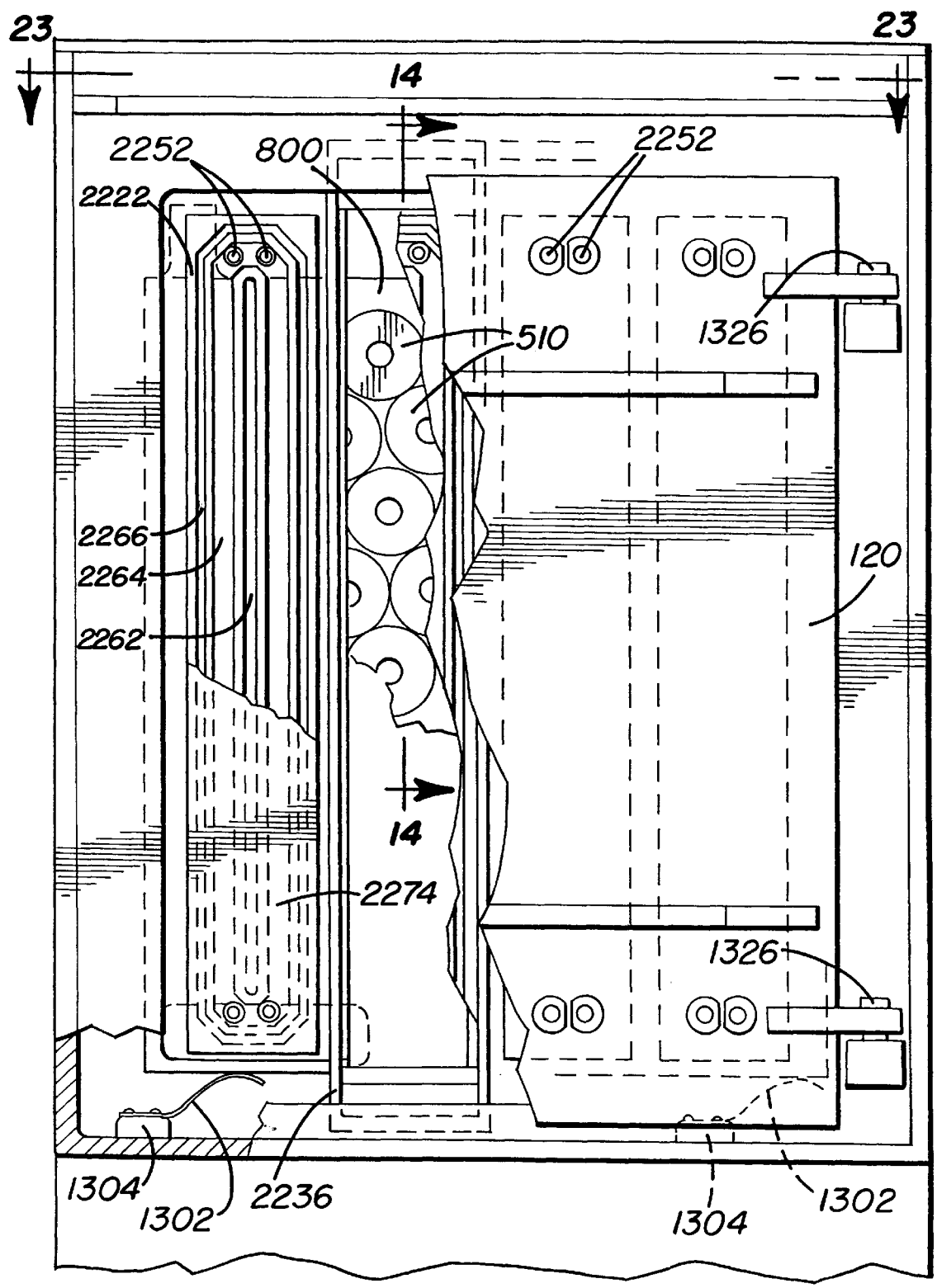
FIG. 7 is a side, partial cutaway view of a sputtering chamber utilized in the apparatus of the present invention.
Figure 8:
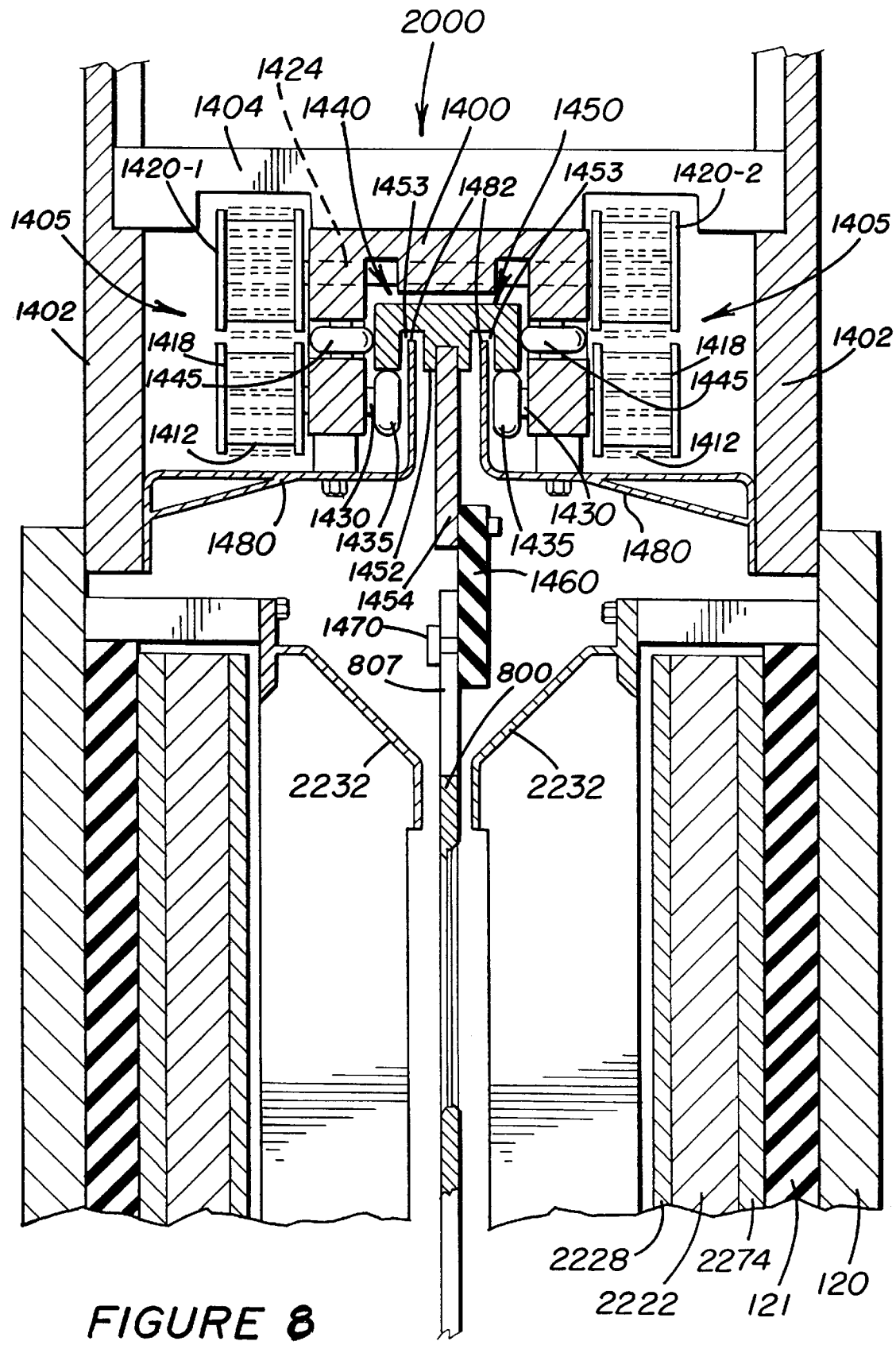
FIG. 8 is an assembled cross sectional view of the substrate transport mechanism, sputtering shields, and pallet viewed along line 14—14 of FIG. 7.

With reference to FIGS. 1, 7, and 8, a system for transporting substrates through sputtering apparatus 10 and along return path 50 utilized in the apparatus and process of the present invention, will be hereinafter described.

The transport system of the present invention utilizes a plurality of individually powered transport platforms 2400. Each transport platform 2400 may be individually controlled with respect to motion and speed by controlling a motor assembly (not shown) associated with each platform. Hence, at any given time, only those motor assemblies associated with platforms which are transporting substrates along their lengths at any given time need be powered. Additionally, the transport speed of each individual platform 2400 is user-controlled, with transfer speeds generally selectable within a specific range, allowing substrate transport within sputtering apparatus 10 and return path 50 at varying rates. Each transport platform 2400 is provided with one or more proximity sensors (not shown) which output pallet position signals to the electronic control system of the present invention. This allows the electronic control system and the system operator to identify the location of each and every substrate in sputtering apparatus 10 and along return path 50 at any given time. Three such proximity sensors per transport platform 2400 are provided for each of the 19 platforms used in conjunction with sputtering apparatus 10: 17 platforms in chamber modules 12–30 and two additional platforms at entrance platform 210, at the entrance to load lock chamber 12, and exit platform 220, outside exit lock chamber 30. Twenty (20) transport platforms 2400 are provided along return path 50, each such platform stage along return path 50 having one proximity sensor per platform.

With reference to FIGS. 7, and 8, each transport platform 2400 includes a motor assembly (not shown) coupled to timing chain assembly 1405, including chains 1410 and 1412, and sprocket wheels 1414–1422, mounted on transport beam 1400. An identical timing chain assembly 1405 is located on the opposite side of each transport platform 2400 (as shown in FIG. 8).

Generally, sprocket wheels 1421 and 1422 have a single set of teeth and are mounted to beam 1400 to provide tension adjustment for timing chains 1410 and 1412, respectively. Wheel 1416 has a double set of teeth, one set engaging timing chain 1410 and one set engaging timing chain 1412. Timing chains 1410 and 1412 may be manufactured from polyurethane; however, in load lock chamber 12 and exit lock chamber 30, stainless steel timing chains are required due to reduce excessive particulate matter generated and circulated during repetitive pump-down and venting cycles when using polyurethane timing chains. Alternatively, stainless steel chains may be utilized throughout the system.

Sprocket wheels 1414 and 1418 may have single or double sets of teeth, as needed. Wheels 1414, 1416 and 1418 are coupled to spindles 1430, passing through beam 1400, which are in turn coupled to rubber roller wheels 1435 in cavity 1440 of beam 1400. Sprocket wheel 1420-1 is coupled to a spindle 1424 passing through beam 1400 into cavity 1440 to translate the motion of sprocket wheel 1420-1 to sprocket wheels 1420-2 located on the opposite side of transport platform 2400. Wheels 1420 generally have two sets of teeth, one set engaging timing chain 1412, the other set engaging a chain or gear assembly coupled to the motor assembly associated with the particular transport platform for powering timing chain assemblies 1405. Through bores 1425 are provided in beam 1400 adjacent to the upper portion of each transport beam 1400 to allow sprocket wheels 1420 to be positioned at any of three points along transport platform 2400 as the positioning of the motor assembly relative to transport platform 2400 requires.

It should be noted that the distance between wheels 1414 and 1416, and the distance between wheels 1416 and 1418, is equal. Further, when assembled into a complete transport system encompassing, for example, both apparatus 10 and return path 50, the distance between respective end wheels 1414 and 1418 on adjacent platforms is equal to the distance from wheels 1414 and 1418 to wheels 1416. Thus, the inter-roller spacing of rubber wheels 1435 is equal through the entire transport system.

Substrate carrier 1450 is receivable in interior cavity 1440 of transport beam 1400. Substrate carrier 1450 includes E-beam assembly 1452 and substrate mounting member 1454. E-beam assembly 1452 enters cavity 1440 seated atop rubber wheels 1435 and is transported along the path of each platform 2400 when the individual motor assembly for that platform drives gears 1420 into motion. Guide wheels 1445 are provided to ensure alignment of substrate carrier 1450, and especially E-beam assembly 1452, within cavity 1440.

Each transport platform 2400 is mounted to a wall portion 1402 of sputtering apparatus 10 by a cross beam 1404 and hex nuts 1406. Dual insulating members 1460 isolate substrate carrier 1450, and individual transport platforms 2400, from thermal and electrical energy which is transferred to pallet 800 during transport through sputtering apparatus 10. Insulating members 1460 may be manufactured from an insulating material such as DuPont's DELRIN thermoplastic elastomer. Insulating members 1460 are preferably bolted to substrate mounting member 1454 and include a T-shaped mounting pin 1470 for securing pallet 800. Apertures 805 are provided on extensions 807 of pallet 800 to allow pins 1470 to pass therethrough and pallet 800 to be mounted on carrier 1450.

Maintaining a contaminant-free environment within sputtering apparatus 10 is crucial to quality control in the provision of multi-layer coatings on substrates. Utilization of an overhead drive transport system in the system of the present invention allows a large variety of substrates to be coated within a single apparatus. However, such overhead systems suffer from excessive particulate generation which may fall from the transport system to contaminate disk substrates carried below. The transport system of the present invention is provided with unique shielding to prevent particulate contaminants generated by the overhead transport drive system from entering chamber modules 12–30 of sputtering apparatus 10. As shown specifically in FIG. 8, contaminant shields 1480 are bolted on the lower portion of transport platform 2400 in the interior of chamber modules 12–30. Shields 1480 are shaped so as to bar particulate contaminants generated by each transport platform 2400 from the interior of chamber modules 12–30. In addition, E-beam assembly 1452 is specifically designed such that ends 1482 of shields 1480 are interposed in grooves 1453 of E-beam assembly 1452, minimizing entry of particulate matter into the interior of chambers 12–30.

The transport system described herein further minimizes particulate generation by eliminating metal-to-metal contact. This particular feature of the transport system provides excellent electrical isolation of the substrate, thus providing the added advantage of allowing the substrate to be biased during, for example, carbon sputtering in chamber 28, thereby improving the quality of the carbon coating deposited.

Each individual transport platform 2400 can move substrate carrier 1450 at a velocity ranging up to 24 ft/min along the entire transport path. Optimally, transport speeds within chambers 12–30 of sputtering apparatus 10 are adjustable up to 24 ft/min. Adjustment of drive speeds and each transfer platform 2400 is controlled by the electronic control system as discussed in Section K of this specification.

H. Substrate Heating System

Uniform substrate temperature is crucial to producing a superior thin film by sputtering processes. FIGS. 9 through 15 illustrate a heating assembly configuration which accomplishes this goal in sputtering apparatus 10.

Specifically, sputtering apparatus 10 includes a heating assembly whose elements are distributed between dwell heating chamber 14, passby heating chamber 16 and dwell chambers 18 and 22.

Figure 11:
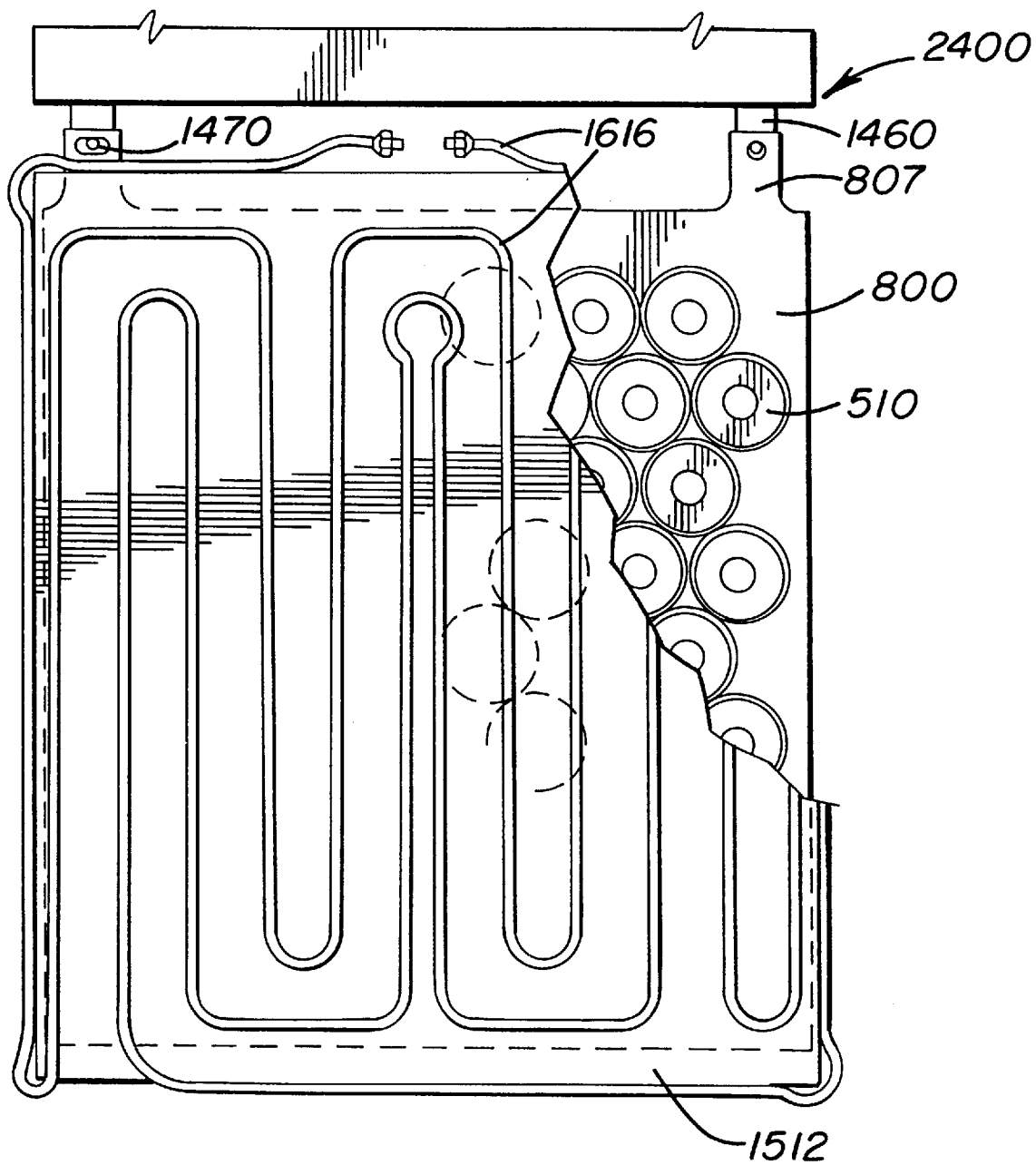
FIG. 11 is a view of the main heating lamp mounting tray and cooling lines along line 17—17 in FIG. 9.

As shown in FIGS. 9 through 11, dwell heating chamber 14 features eight horizontal banks 1510A, 1510B, 1510C, 1510D, 1620A, 1620B, 1620C, 1620D of tubular quartz radiant heating lamps 1514. Banks 1510A, 1510B, 1620A and 1620B are housed in one shallow gold-plated stainless steel tray 1512 and banks 1510C, 1510D, 1620C and 1620D are housed in a second shallow gold-plated stainless steel tray 1512. Each bank 1510A, 1510B, 1510C, 1510D includes eleven 1.5 kW lamps 1514 connected in parallel, vertically aligned and interdigitated to overlap lamp ends between the banks. Individual lamps are separated horizontally by a distance of 3 inches. Each bank 1620A, 1620B, 1620C and 1620D includes three 1.5 kW lamps 1514 connected in parallel, horizontally aligned and interdigitated to overlap lamp ends within each bank. Tubular quartz radiant heating lamps such as those commercially available from General Electric Corporation Lamp Division of Albany, N.Y. are suitable for this purpose.

Within each tray 1512, banks 1510A, 1510B, 1620A and 1620B, and banks 1510C, 1510D, 1620C and 1620D are arrayed vertically. Trays 1512 measure 37.5 in. long (l) by 2⅝ in. deep (d) by 32⅜ in. wide (w), with one tray 1512 mounted on chamber door 114, and the other mounted on rear chamber wall 99. Each tray 1512 is protected from overheating by a circulating coolant fluid provided through cooling lines 1516.

As shown in FIGS. 12 through 14, passby heating chamber 16 includes ten horizontal banks 1818A, 1818B, 1818C, 1818D, 1818E, 1818F, 1920A, 1920B, 1920C, and 1920D of tubular quartz radiant heating lamps 1514. Each bank 1818A, 1818B, 1818C, 1818D, 1818E, and 1818F features six 1.5 kW lamps 1514 of the same type and mounted in the same fashion as those in dwell heating chamber 14. Individual lamps 1514 are separated by a distance of 2 inches. Each bank 1920A and 1920B features a single horizontally aligned 1.5 kW lamp 1514.

Banks 1818A, 1818B, 1818C, 1920A and 1920B, are arrayed vertically in gold-plated stainless steel tray 1812 and banks 1818D, 1818E, 1818F, 1920C and 1920D are arrayed vertically in a second gold-plated stainless steel tray 1812. With the exception of housing five horizontal banks each, instead of four, trays 1812 are identical in measurement and respective mounting to chamber door 116 and rear chamber wall 100 as trays 1512 in dwell heating chamber 14. Likewise, trays 1812 feature cooling lines 1716 to provide protection from overheating.

The output from banks 1510A, 1510B, 1510C, 1510D, 1620A, 1620B, 1620C, 1620D, 1818A, 1818B, 1818C, 1818D, 1818E, 1818F, 1920A and 1920B, may be set and monitored for individual lamp operating voltages and currents via the electronic controlling system, described fully in Section K, to operate at desired power levels and for desired periods of time. In the present embodiment, heater banks 1510A–1510D, 1620A–1620B, 1818A–1818F, and 1920A–1920D are operated in sets, wherein each set comprises banks 1510A/1510B, 1510C/1510D, 1620A/1620C, and 1620B/1620D, operated in parallel. Alternatively, bank sets 1620A/1620C, 1620B/1620D, 1510A/1510C, and 1510B/1510D, may be operated in parallel. Similarly, opposing banks 1818A/1818D, 1818B/1818E, 1818C/1818F, and 1920A/1920D are adjustably controlled in parallel. Preferably, independent control of each bank 1510A–1510D, 1620A–1620B, 1818A–1818F, and 1920A–1920B, may be provided by the electronic control system. Such control of banks 1510A, 1510B, 1510C, 1510D, 1620A, 1620B, 1620C, 1620D, 1818A, 1818B, 1818C, 1818D, 1818E, 1818F, 1920A, 1920B, 1920C, and 1920D facilitates adjustment of heating power to meet the preheating requirements of different substrate materials.

Figure 15:
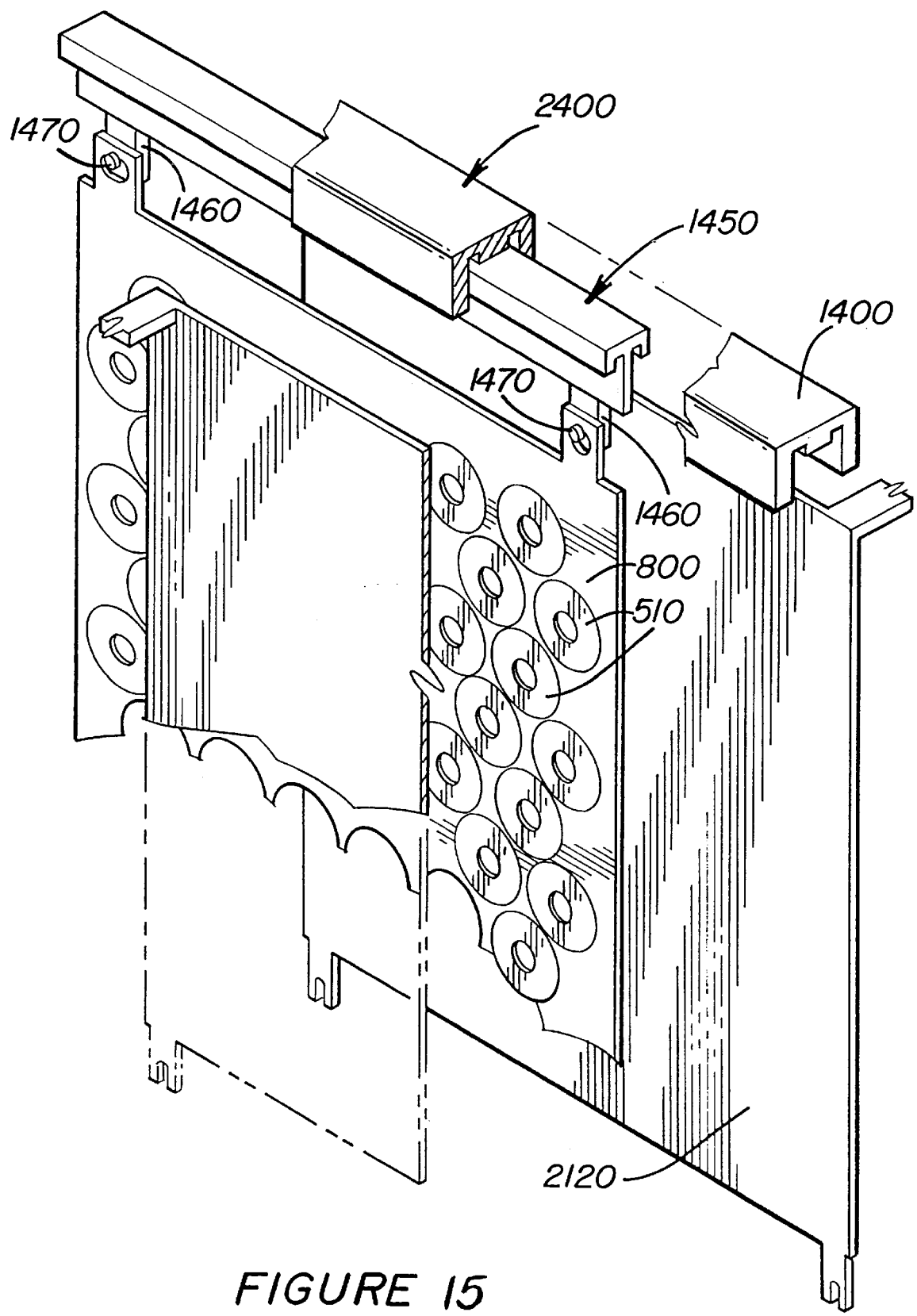
FIG. 15 is a perspective, partial view of a heat reflecting panel, pallet, and substrate transport system utilized in the apparatus present invention.
Figure 16:
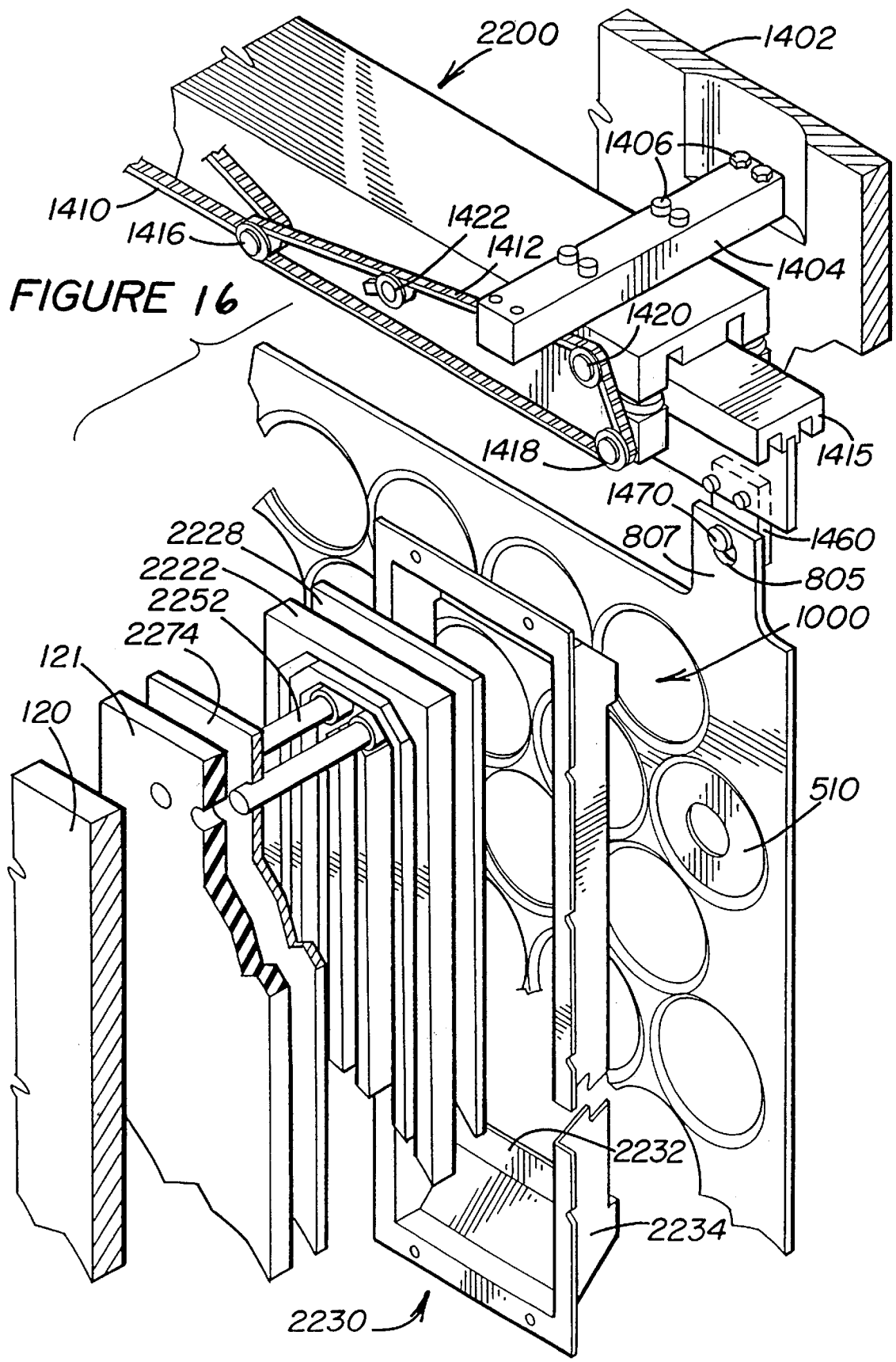
FIG. 16 is a perspective, exploded view of a portion of a pallet, substrate transport mechanism, sputtering shield, and cathode assembly utilized in the sputtering apparatus of the present invention.

As shown in FIG. 15, dwell chambers 18 and 22A and 22B each have two gold-plated stainless steel reflecting panels 2120, one each on opposite chamber walls 118, 122A, and 122B and rear chamber walls 101, 102 and 104. Reflecting panels 2120 measure 34⅜ in. in length by 28 in. in width by 0.09 in. thick.

The heating assembly cooperates with the other elements of sputtering apparatus 10 to contribute to the overall high throughput and high quality sputtered films produced. Specifically, as pallet 800 proceeds through dwell heating chamber 14, banks 1510A, 1510B, 1510C, 1510D, 1620A, 1620B, 1620C and 1620D rapidly commence heating to warm both sides of disk substrates 510 before film deposition. If, for example, the desired substrate temperature is about 200° C., the heating time in dwell heating chamber 14 is approximately 30 seconds. Heating lamp warmup time is negligible since low power (about 143 W) is delivered continuously to the lamps to keep lamp filaments warm.

In the geometrically uniform array of heating lamps created by banks 1510A, 1510B, 1510C and 1510D, more heat is radiated towards disk substrates 510 carried in the center of pallet 800 as compared to disk substrates 510 carried in rows 810, 820, 870 and 880. In combination with efficient heat reflection from gold-plated stainless steel trays 1512, there is a need to equalize across pallet 800 the amount of heat radiated to individual disk substrates 510. Banks 1620A and 1620B serve as 'trim heaters' to boost the amount of heat radiated to disk substrates 510 carried in rows 810, 820, 870 and 880 of pallet 800. Although such trim heaters are not required, through equalization of heat distribution across pallet 800, trim heaters 1620A and 1620B allow control of coercivity of the deposited film to within about 60 Oe.

To further insure uniform substrate temperature prior to film deposition, a second heating cycle is performed in passby heating chamber 16. Pallet 800 enters passby heating chamber 16 through door D3. The electronic control system enables high power input to banks 1818, 1920, for example, through internal software timers or by reading the output of optical sensor SEN10 capable of detecting pallet motion through the sputtering apparatus 10. As pallet 800 begins to depart passby heating chamber 16, the electronic control system reduces the power of those lamps 1514 positioned at the leading edge of pallet 800 or turns off power to those lamps entirely in response to timing parameters incorporated in the electronic control system software, or sensor SEN13, in order to avoid relative overheating of the trailing edge of the pallet 800.

Banks 1818A, 1818B, 1818C, 1818D, 1818E, 1818F, 1920A and 1920B are initiated and will deliver heat for a preset, empirically determined time as monitored by a software timer in the electronic control system. In addition, a software delay timer is triggered to control the opening of door D3, allowing pallet 800 to proceed into passby heating chamber 16. As a result, when pallet 800 triggers SEN13 in dwell chamber 18, after a certain period, lamps 1514 on the leading edge of pallet 800 are reduced in power or turned off entirely, depending on the transport speed through dwell chamber 18. In addition, a Mikron temperature sensor (not shown) may be positioned at the entrance of passby heating chamber 16, allowing the system operator through the electronic control system to adjust the power output of banks 1818A, 1818B, 1818C, 1818D, 1818E, 1818F, 1920A, 1920B, 1920C and 1920D to compensate for thermal variations between disk substrates 510 and across pallet 800. In this manner, a uniform temperature profile is established across the surface of pallet 800 and between individual disk substrates 510, thereby avoiding higher coercivities for those substrates positioned on the trailing edge of pallet 800.

Radiative heat losses from pallets and substrates proceeding through sputtering apparatus 10 are minimized by virtue of gold-plated stainless steel reflective panels 2120.

The cooperation of these elements in the heating assembly contributes to the high throughput of sputtering apparatus 10 by promoting rapid and uniform heating of substrates before film deposition. The heating assembly also efficiently maintains the desired substrate temperature by minimizing radiative heat losses as disk substrates 510 proceed through sputtering apparatus 10. Moreover, integration with the electronic control system introduces added flexibility with respect to selecting and adjusting dwell times and heating rates as required by different substrates and sputtered films.

L. Process In General

Examples 1 and 2 illustrate process parameters for sputtering apparatus 10 to produce 950 Oe and 1200 Oe, respectively, hard drive disks.

Example 1

As illustrated in FIG. 2, once engaged by substrate carrier 1450, pallet 800 loaded with disk substrates 510 proceeds through door D1 into load lock chamber 12. After pallet 800 enters load lock chamber 12, door D1 closes. Load lock chamber 12 is pumped down to 50 microns (50 mTorr) in 20 seconds by mechanical roughing pump MP1. Door D2 opens, allowing pallet 800 to proceed at 6 ft/min into dwell heating chamber 14. Dwell heating chamber 14 has already been evacuated by cryo pump C1 to $10^{-5}$ Torr (0.01 microns). As pallet 800 proceeds through the chamber, it triggers proximity position sensors which in turn initiate heaters. Heating lamp warmup time is negligible since, during sputtering operations, the lamp filaments are kept warm by a low power level. Pallet 800 and disk substrates 510 soak in dwell heating chamber 14 for 30 seconds with the temperature about 220° C. During this soak period, the heating power applied is 3.1 kW per bank. Argon enters through gas manifolds to backfill dwell heating chamber 14 and equalize the internal pressure before door D3 opens, allowing pallet 800 to proceed. This backfill also maintains pressure equilibrium throughout the apparatus, essential to stabilizing sputtering processes. Door D3 opens to passby heating chamber 16, triggering the initiation of passby heaters. Pallet 800 enters passby heating chamber 16 and after clearing sensor SEN10, triggers the closure of door D3. This chamber also has been evacuated by cryo pump C2 to about $10^{-5}$ Torr (0.01 microns). Passby heating banks 1818A–1818F operate using 7.6 kW per bank. Lamps 1514 on the leading edge of the pallet reduce power as pallet 800 exits into dwell chamber 18 at 6 ft/min. Pallet 800 proceeds through dwell chamber 18 which has already been evacuated by cryo pump C3 to $10^{-5}$ Torr. The pallet proceeds at 6 ft/mi.n past heat reflective panels 2120.

Pallet 800 enters chromium sputtering chamber 20 maintained at 9–12 microns (9–12 mTorr) of argon pressure with argon flow at 300 standard cubic centimeters per minute (sccm). Pallet 800 travels at 6 ft/min as it passes sputtering targets 2226–2229. The sputtering power is 7.5 kW per cathode, with a 1,000 Å thick chromium film deposited. Transport speed through dwell chamber 22A, buffer chamber 24A and dwell chamber 22B is 12 ft/min through open doors D5 and D6. These three chambers are pumped by cryo pumps C4, C5, and C6. Pallet 800 enters magnetic sputtering chamber 26 maintained at 9–12 microns (9–12 mTorr) of argon by cryo pumps C6 and C7 with argon flow at approximately 400 sccm. The transport speed through sputtering chamber 26 is 6 ft/min. The sputtering power is 7.5 kW per cathode, depositing a 800 Å thick CoCrTa film. Transport speed through dwell chambers 22C and 22D and buffer chamber 24B is 6 ft/min. Dwell chambers 22C, 22D and buffer chamber 24B are pumped by cryo pumps C7, C8 and C9. Pallet 800 enters carbon sputtering chamber 28 maintained at 9–10 microns (9–12 mTorr) by cryo pumps C9 and C10 with argon and up to 15% hydrocarbon gas like ethylene or acetylene flowing at 100 sccm. The transport speed is 2.8 ft/min as the pallet passes the sputtering targets in carbon sputtering chamber 28. Sputtering power is 7 kW per cathode with a film thickness of 350 Å. Transport speed through dwell chamber 22E, buffer chamber 24C and exit buffer chamber 29 is 6 ft/min with doors D9 and D10 opening and closing sequentially to allow pallet 800 to proceed. Dwell chamber 22E is pumped by cryo pumps C10 and C11, buffer chamber 24C and exit buffer chamber 29 are pumped by cryo pump C12. Argon is backfilled into exit buffer chamber 29 by cryo pump C12 to equalize the pressure differential existing with respect to exit lock chamber 30. Pallet 800 next proceeds through exit lock chamber 30 which is vented to the atmosphere by chamber vent valve CV5 in 10 seconds. Pallet 800 then proceeds to robotic unloading station 45.

To produce a 1,200 Oe magnetic film, the soak time in dwell heating chamber 14 may be increased to about 50 seconds to allow the substrate temperature to increase to approximately 250° C. and/or the pallet transport speed through chromium sputtering chamber 20 may be reduced in order to allow a thicker deposition of a chromium underlayer. Adjustment of soak time and/or substrate temperature parameters depends on the life cycle of the pallet—a pallet which has proceeded through numerous sputtering runs will have a thicker film deposition which can absorb more water and consequently would have more water to outgas before film deposition.

The many features and advantages of the apparatus and process of the present invention will be apparent to those skilled in the art from the description of the preferred embodiments and the drawings.

Thus, a high throughput process and apparatus which accomplishes the objectives of the invention and provides the above advantages by providing a comprehensive in-line sputtering system utilizing matched component elements to process multiple large single sheet or pallet transported discrete substrates in a continuous, variable speed, sputtering process has been described. Such an apparatus and method can process up to 3,000 95 mm disk substrates, and 5,300 65 mm disk substrates, per hour. Such high volume production offers both high volume production and, consequently, cost savings per disk on the order of $4.00 per disk over prior art sputtering apparatus and processes. As noted throughout this specification, such an apparatus and process is achieved through a novel combination of process and structural elements involved in disk preparation, provision of a sputtering environment, transportation of substrates through the sputtering environment at rapid speeds and in a contaminant free manner, heating the substrates to optimal thermal levels for sputtering, and sputtering the substrates through a series of substantially isolated, non-crosscontaminating sputtering steps.

The apparatus of the present invention provides a high-speed in-line sputtering apparatus for producing superior multilayer films on substrates, such as disks suitable for use in Winchester-type hard disk drives. The process of the present invention provides an improved method of providing multilayer coatings to a variety of substrate types at a much greater rate than prior art methods.

Also described herein are a novel means for heating substrates to be coated, a novel sputtering magnetron design, a novel, variable speed, overhead, non-contaminating substrate transportation system and a comprehensive, centralized, programmable electronic means for controlling the apparatus and process are provided. Still further, when she process and apparatus are used for providing magnetic coatings for substrates, such as disks, to be utilized in hard disk drives using Winchester-type technology, a unique disk texturing method for improving the disk's magnetic recording properties, and a novel disk carrier (or pallet) design which contributes to uniform substrate heating characteristics in a large, single, high capacity pallet, are also provided herein. Numerous variations are possible as will be apparent to those skilled in the art; such variations are intended to be within the scope of the invention as defined by this specification and the following claims are intended to cover all the modifications and equivalents falling within the scope of the invention.

What is claimed is:

1. A sputtering apparatus for providing a single or multilayer coating to the surface of a plurality of substrates, said apparatus comprising:

a plurality of chambers;

an input end and an output end; and a plurality of pallets for carrying substrates of said plurality of substrates from said input end to said output end, said pallet including:

a plurality of notches extending inward from edges of the pallet;

a plurality of slots including arcuate sections concentric with the substrate-carrying region to which it is closest; and at least one cavity near at least one edge portion of the pallet;

said plurality of notches, said plurality of slots, and said at least one cavity provided for preventing warping of said pallet across a width of said pallet and along a length of said pallet by providing a space into which said pallet may expand upon an increase in pallet temperature.

2. A sputtering apparatus as recited in claim 1, further comprising at least 56 substrate-carrying regions configured to securely support a plurality of 95 mm diameter disk substrates.

3. A sputtering apparatus as recited in claim 1, further comprising at least 99 substrate-carrying regions configured to securely support a plurality of 65 mm diameter disk substrates.

4. A sputtering apparatus as recited in claim 1, further comprising at least 149 substrate carrying regions configured to securely support a plurality of 48 mm diameter disk substrates.

5. A pallet for transporting a plurality of substrates through a sputtering apparatus, comprising:

a plurality of substrate-carrying regions for securely supporting the plurality of substrates, which plurality of substrate-carrying regions are provided in the pallet such that lines connecting the centers of three adjacent substrate-carrying regions of said plurality of substrate-carrying regions approximate an equilateral triangle so as to define a hexagonal orientation of said substrate-carrying regions;

a plurality of notches extending inward from edges of the pallet;

a plurality of slots including arcuate sections concentric with the substrate-carrying region to which it is closest; and at least one cavity near at least one edge portion of the pallet;

said plurality of notches, said plurality of slots, and said at least one cavity provided for preventing warping of the pallet across a width of the pallet and along a length of the pallet by providing a space into which the pallet may expand upon an increase in pallet temperature.

6. A pallet for transporting a plurality of substrates through a sputtering apparatus as recited in claim 5, wherein the pallet is comprised of the same material as the plurality of substrates.

7. A pallet for transporting a plurality of substrates through a sputtering apparatus as recited in claim 5, wherein the pallet is comprised of aluminum.

8. A pallet for transporting a plurality of substrates through a sputtering apparatus as recited in claim 5, further comprising a plurality of holes for receiving a sensor from a substrate loading or unloading robot, enabling the robot to orient itself with respect to the substrate-carrying regions for loading or unloading the substrates therein.

9. A pallet for transporting a plurality of substrates through a sputtering apparatus as recited in claim 5, wherein said substrate-carrying regions are substantially circular.

10. A pallet for transporting a plurality of substrates through a sputtering apparatus as recited in claim 9, wherein said substrate-carrying region further comprises:

a groove in between a front surface and a back surface of the pallet and along a bottom portion of said substrate-carrying region for supporting a substrate of the plurality of substrates at a bottom portion of said substrate, and a lip at the back surface of the pallet and along a top portion of said substrate-carrying region for supporting said substrate at a top portion of said substrate.

11. A pallet having a front portion and a back portion for transporting a plurality of substrates through a sputtering apparatus, comprising:

a plurality of circular substrate-carrying regions provided in the pallet such that lines connecting the centers of three adjacent substrate-carrying regions of said plurality of substrate-carrying regions approximate an equilateral triangle so as to define a hexagonal orientation of said substrate-carrying regions, said plurality of substrate-carrying regions further including:

a groove in between the front surface and the back surface of the pallet and along a bottom portion of said substrate-carrying region for supporting a substrate of the plurality of substrates at a bottom portion of said substrate, and a lip at the back surface of the pallet and along a top portion of said substrate-carrying region for supporting said substrate at a top portion of said substrate;

a plurality of notches extending inward from edges of the pallet;

a plurality of slots including arcuate sections concentric with the substrate-carrying region to which it is closest; and at least one cavity near at least one edge portion of the pallet;

said plurality of notches, said plurality of slots, and said at least one cavity provided for preventing warping of the pallet across a width of the pallet and along a length of the pallet by providing a space into which the pallet may expand upon an increase in pallet temperature.

* * * * *